United States Patent [19]

Judell et al.

[11] Patent Number: 4,457,664
[45] Date of Patent: Jul. 3, 1984

[54] WAFER ALIGNMENT STATION

[75] Inventors: Neil H. Judell, Jamaica Plain; Robert C. Abbe, Newton; Noel S. Podiye, Needham Heights; Roy Mallory, Bedford, all of Mass.

[73] Assignee: ADE Corporation, Newton, Mass.

[21] Appl. No.: 360,386

[22] Filed: Mar. 22, 1982

[51] Int. Cl.³ .............................................. B65G 47/24
[52] U.S. Cl. .................................. 414/779; 198/394; 198/395; 414/754; 414/757; 414/786
[58] Field of Search ................ 198/394, 395; 414/754, 414/757, 779, 786

[56] References Cited

U.S. PATENT DOCUMENTS

| | | |
|---|---|---|
| 3,437,929 | 4/1969 | Glenn . |
| 3,618,742 | 11/1971 | Blanchard et al. ................ 198/395 |
| 3,695,414 | 8/1972 | Wiesler et al. . |
| 3,702,923 | 11/1972 | Wiesler et al. . |
| 3,785,507 | 1/1974 | Wiesler et al. . |
| 4,024,944 | 5/1977 | Adams et al. ....................... 198/394 |
| 4,103,232 | 7/1978 | Sugita et al. . |
| 4,240,032 | 12/1980 | Johnson et al. . |

Primary Examiner—Jeffrey V. Nase
Attorney, Agent, or Firm—Weingarten, Schurgin, Gagnebin & Hayes

[57] ABSTRACT

An automatic wafer alignment station is disclosed for aligning a wafer having flats about its centroid with the flats oriented in a preselected spatial direction. The wafer is held by a vacuum chuck which is operatively connected to a motor driven carriage for controlled movement about an X axis, to a $\theta$ actuator carried by the carriage for controlled rotation about the axis of the chuck, and to a Z actuator carried by the carriage for controlled motion about a Z axis. An X capacitive sensor and a Z capacitive sensor are positioned near the wafer. An X processing and Z compensating circuit is responsive to the X and the Z capacitive sensor output signals and provides an electrical signal that has values which exclusively represent the position of the edge of the wafer along the X axis only over a predetermined angular range. Circuit means including an A/D converter and a microprocessor respond to the electrical signal and produce a plurality of corrective signals to the X, Y, and $\theta$ actuators for aligning the wafer about its centroid and for orienting the flats of the wafer in a preselected spatial orientation.

23 Claims, 10 Drawing Figures

4,457,664

WAFER ALIGNMENT STATION

FIELD OF THE INVENTION

This invention is drawn to the field of materials processing, and more particularly, to a semiconductor wafer alignment station.

BACKGROUND OF THE INVENTION

The production and quality control processes used by semiconductor device manufacturers and material producers often require a precise knowledge of such wafer characteristics, as flatness, thickness, resistivity, type, and orientation, among others. Automated, high throughput assembly line like wafer checking systems are employed to obtain the desired information. The wafers must be aligned about their centers, and their flats selectively oriented in space, before being fed to the selected wafer characterization stations of a particular wafer checking system.

SUMMARY OF THE INVENTION

The present invention provides a wafer alignment station that automatically aligns a wafer, having flats, about its centroid and orients the flats selectively in space which is suitable for use in automated production and quality control. The wafer alignment station suitably may be packaged in a module which is compatible for use with other wafer characterization stations in a high throughput material processing system. The microprocessor based wafer alignment station of the invention ordinarily requires less than one and a half (1.5) seconds after receipt of a wafer to align it about its centroid and to selectively orient its flat in space and can process on the average up to about two thousand (2,000) wafers per hour routinely without the need for operator intervention.

The novel wafer alignment station comprises a platform for holding a wafer; first means, connected to the platform, for rotating the platform about its axis $\theta$ radians, for moving the platform along an X axis, and for moving the platform along a Z axis. A sensor is positioned near the platform for providing an electrical signal having values that are representative of the position of the edge of the wafer along the X axis over a predetermined angular range. A second means, coupled to the first means and responsive to the electrical signal, is operative to determine the centroid of the wafer and to produce a plurality of corrective signals to the first means for aligning the wafer about its centroid. The wafer usually has a generally circular perimeter having at least one flat region, and the second means is further operative to determine the location of a selected flat region and to produce a corrective signal for aligning the flat region in a preselected spacial direction. Typically, the wafer has one or more flats, at least one of which is a major flat and the second means is operative to selectively orient the major flat in space.

According to one aspect of the preferred embodiment, a vacuum chuck is used to hold the wafer and is operatively connected to a motor-driven carriage for movement along the X axis, to a $\theta$ motor for rotation about the axis of the chuck, and to a stepping motor for movement about the Z axis. The X actuator assembly, the $\theta$ motor, and the Z actuator controllably manipulate the wafer to physically align the water about its centroid with the flats selectively oriented in space.

According to another aspect of the preferred embodiment, a sensor having an X and a Z capacitive sensor are positioned near the wafer for sensing the position of the wafer along the X and the Z axes over a predetermined angular range. An X processing and Z compensating circuit including an inverting amplifier in a virtual ground arrangement is responsive to the sensor output signal and operative to stabilize the magnitude of the current through the Z sensor and hold it equal to a constant.

According to yet another aspect of the preferred embodiment, the second means comprises an analog-to-digital converter for providing a digital representation of the X processed and Z compensated signal. A microprocessor, responsive to the digital representation, is operative to determine the position of the centroid, to determine the location of the preselected flat region, and to produce the above noted corrective signals to the respective X, $\theta$, and Z actuators for aligning the wafer about its centroid and for orienting the flats selectively in space.

The processor spins the wafer on the vacuum chuck one full turn, digitally filters the data corresponding to the position of the edge of the sensor along the X axis to eliminate noise and the flats information, calculates from the filtered data a vector defined between the point which corresponds to the centroid and the point which corresponds to the axis of the vacuum chuck, and produces from the vector those corrective signals necessary to align the wafer about its centroid. After the wafer is centered, the processor spins the wafer on the vacuum chuck a second full turn for obtaining data having values that are representative of the position of the edge of the wafer aligned about its centroid, calculates from the aligned data the $\beta$ angle that corresponds to the position of the flat region relative to the X axis, and produces a $\theta$ corrective signal for aligning the flat region selectively in space. The data produced by the second spin of the wafer also serves as a check on whether the wafer is aligned abouts its centroid or not. The processes are repeated until the wafer is centered.

Accordingly, it is an object of the invention to provide a wafer alignment station for aligning a wafer about its centroid and for orienting the flats selectively in space.

It is another object to provide a wafer alignment station that operates automatically.

It is another object to provide a wafer alignment station that is suitable for use with other semiconductor wafer material characterization and processing modules.

DESCRIPTION OF THE DRAWINGS

These and other aspects of the present invention are more fully set forth below in the exemplary and non-limiting detailed description of the preferred embodiment and the accompanying drawings of which.

DETAILED DESCRIPTION OF THE PREFERRED EMBODIMENT

Figure 1:
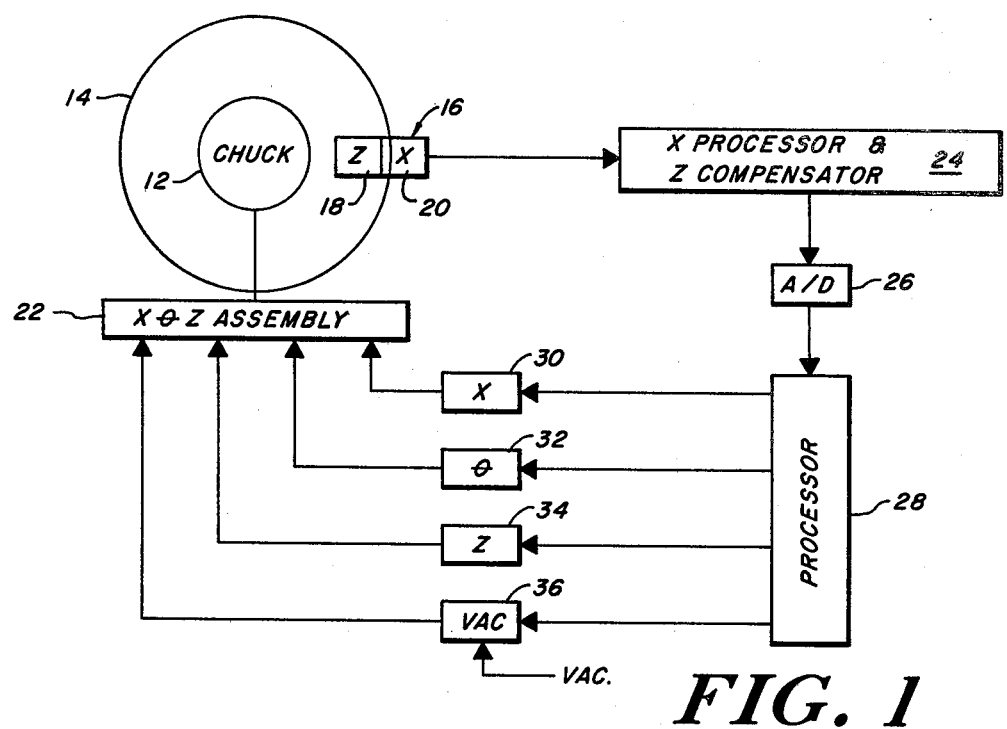
FIG. 1 is a block diagram of the wafer alignment station of the present invention.

Referring now to FIG. 1, generally designated at 10 is a block diagram of the novel wafer alignment station of the present invention. The wafer alignment station 10 includes a vacuum chuck 12 for holding a wafer 14, and a sensor 16 positioned near the chuck 12 so as to be responsive to the position of the edge of the wafer along the X and the Z directions. As will appear more fully below, the sensor 16 preferably consists of a sensor 18 responsive only to the Z coordinate of the position of the wafer 14, and a sensor 20 responsive to the X and to the Z coordinates of the position of the edge of the wafer 14.

An X, $\theta$, and Z assembly 22 is operatively connected to the vacuum chuck 12 for rotating the chuck about its axis $\theta$ radians, for moving the vacuum chuck along the X axis, and for moving the chuck along the Z axis. The X, $\theta$, and Z assembly is responsive to a plurality of control signals to be described and controllably manipulates the chuck to align the wafer about its centroid and orient the flats selectively in space.

An X processing and Z compensator circuit 24 is connected to the output signal of the sensor 16 and is operative to produce an X processed and Z compensated signal that has values which represent the position of the edge of the wafer along the X axis exclusively. An analog-to-digital converter 26 is connected to the X processed and Z compensated electrical signal produced by the circuit 24 and is operative to provide data that digitally represents the position of the edge of the wafer 14 along the X axis. A processor 28, connected to the analog-to-digital converter 26 and responsive to the data, is operative to produce a plurality of control signals to the X, $\theta$, and Z assembly 22 over an X control line 30, a $\theta$ control line 32, and a Z control line 34. The processor 28 also is operative to produce a vacuum control signal over a line 36 for controlling the state of the vacuum applied to the vacuum chuck 12.

As will appear more fully below, the chuck spins the wafer 14 one full turn over the sensor 16 the output signal of which is X processed, Z compensated, and digitized. The processor 28 calculates from the data those X, $\theta$, and Z control signals which, when applied to the assembly 22 over the lines 30, 32, 34, and 36, controllably move, rotate, and apply vacuum to the chuck 12 for aligning the wafer 14 about its centroid. After the wafer is aligned about its centroid, the processor 28 is operative to produce a $\theta$ rotation control signal over the line 32 which spins the wafer 14 another full turn over the sensor 16. The data thus obtained is processed to determine the location of the flats and corrective signals are produced and applied to the assembly 22 to control the chuck 12 such that the flats are selectively oriented in space.

Figure 2A:
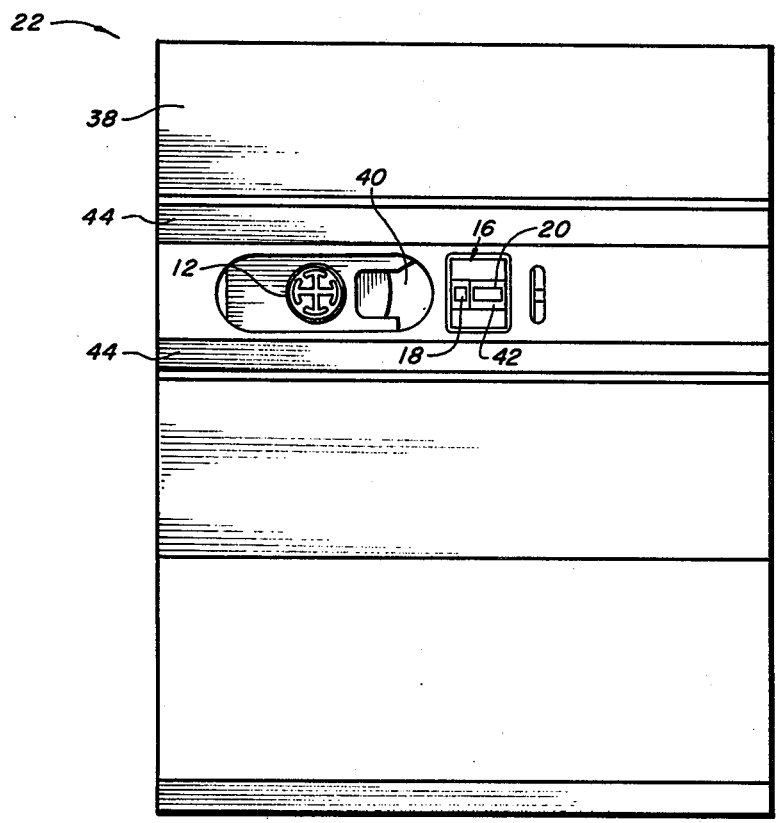
FIG. 2 shows the X, $\theta$, and Z assembly of the wafer alignment station of the present invention in top plan view in FIG. 2A; in bottom plan view with the cover removed in FIG. 2B; and in an inverted side view in FIG. 2C with the side wall removed.

A preferred embodiment of the X, $\theta$, and Z assembly 22 of the wafer alignment station 10 of the present invention is shown in FIG. 2. As shown in FIG. 2A, the station has a top cover plate 38 which is provided with an aperture 40 through which the vacuum chuck 12 can extend in the Z direction and along which it can move in the X direction. The position of the sensor 16 near the chuck 12 is such that the Z sensor 18 is always covered by the wafer 12 while the X sensor 20 is covered to an extent that depends upon the position of the edge of the wafer along the X axis. A guard 42, preferably of a metallic material, is disposed around the capacitive sensors 18 and 20 to prevent stray capacitance from interfering with the proper operation of the sensor 16. Rubber belts 44, supported by the cover plate 38, are preferably used to convey wafers to the chuck 12 for alignment and, after being aligned in the wafer alignment station, to convey the wafers to the selected water characterization and processing stations of a particular wafer checking system, not illustrated.

Figure 2B:
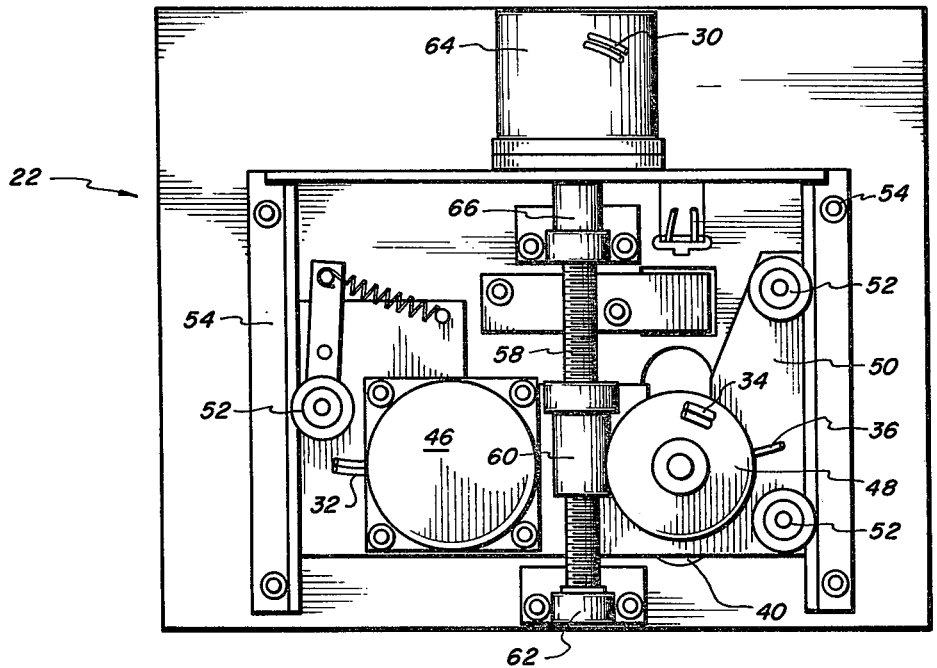
Figure 2C:
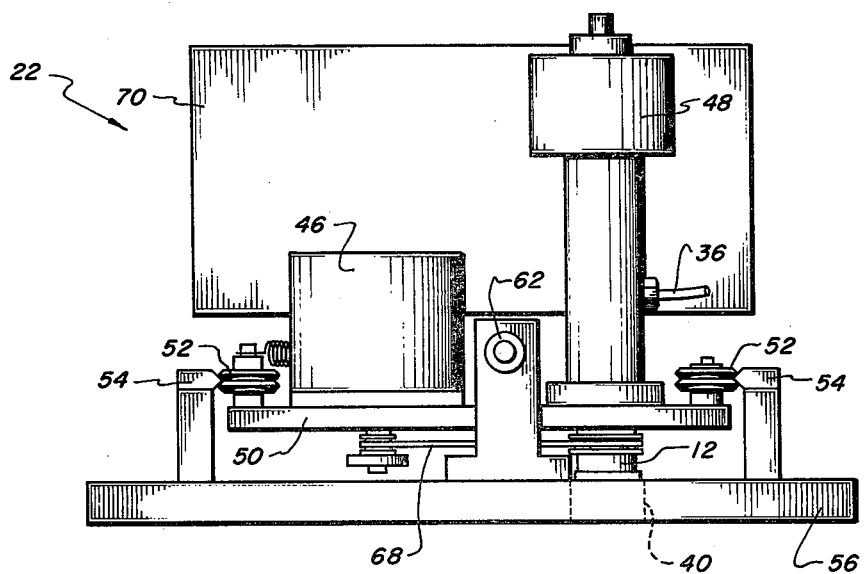

FIGS. 2B and 2C show a bottom and an inverted side view respectively of the X, Z, and $\theta$ assembly 22 of the wafer alignment station of the invention with the housing removed. A $\theta$ actuating motor 46 and a Z actuating motor 48 are fastened to a carriage 50. The carriage 50 is slidably mounted over wheels 52 on a pair of parallel guide rails 54. Rails 54 are securely fastened to a support 56. A worm gear 58 is rotatably mounted in a threaded housing 60 affixed to the carriage 50. One end of the worm gear 58 is rotatably mounted in a journaled bearing 62 which is mounted to the support 56. The shaft of an X actuating motor 64 is connected through a bearing 66 to the other end of the worm gear 58. The housing of the bearing 66 is fastened to the support 56.

The shaft of the $\theta$ motor 46 is connected over a belted wheel arrangement 68 to the shaft of the vacuum chuck 12 to control the $\theta$ coordinate of the position of the chuck 12 as shown in FIG. 2C. The Z coordinate of the position of the vacuum chuck 12 is controlled by the Z actuator 48 by an internal worm gear threaded housing assembly, not shown. An electronics board 70 is provided adjacent the X, Z, and $\theta$ assembly 22 for mounting thereon the electronic components to be described of the invention.

The X, $\theta$, and Z control signals 30, 32 and 34 are applied to the X, $\theta$, and Z actuators 64, 46, and 48, respectively. In response to the X control signal 30, the X stepping motor 64 is controllably turned and rotates the worm gear 58 the threads of which engage the threaded housing 60 for controlling the position of the chuck 12 along the X axis. Likewise, the $\theta$ coordinate of the chuck 12 is controlled by the $\theta$ stepping motor 46 over the belt and wheel assembly 68 in response to the $\theta$ control signal 32, and the Z coordinate of the chuck 12 is controlled by the Z actuator 48 in response to the Z control signal 34. The "on" and the "off" state of the vacuum applied to the vacuum chuck 12 is controlled by the vacuum line 36.

Figure 3A:
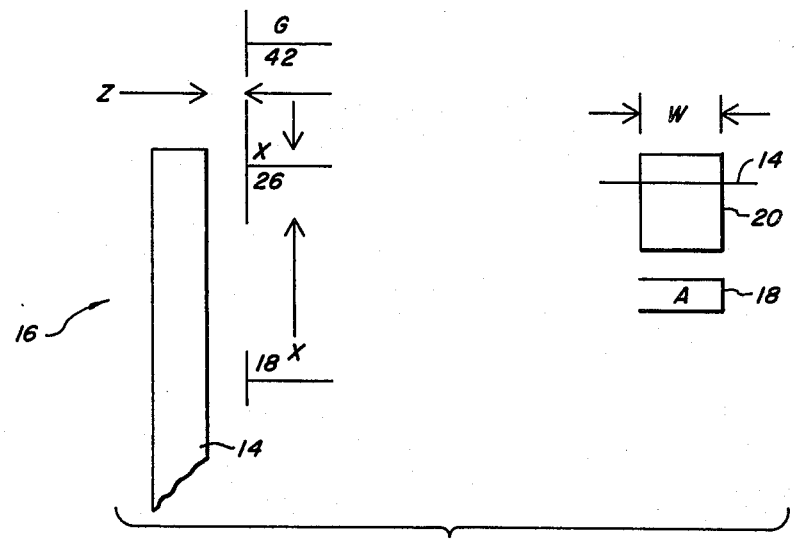
FIG. 3A shows a schematic of the sensor arrangement and FIG. 3B shows a schematic of the X processing and Z compensator circuit of the wafer alignment station of the present invention.

A preferred embodiment of the sensor 16 and of the X processor and Z compensator 24 of the wafer alignment station 10 of the present invention is shown in FIG. 3. As shown in FIG. 3A, the wafer 14 is positioned over both the X capacitive sensor 20 and the Z capacitive sensor 18 of the sensor 16. Neglecting the stray capacitance of the X sensor, $C_{ox}$, the capacitance of the X capacitive sensor 20, $C_x$, is defined:

$$C_x = \frac{\epsilon A}{d} \tag{1}$$

where $\epsilon$ is the dielectric constant of free space, "A" is the area of the plates, and "d" is the plate spacing. It will be appreciated that the body of the wafer forms one of the plates of the capacitive sensor. Assuming that the radius of the wafer 14 is very much greater than the width, W, of the sensor 20, Equation (1) may be rewritten:

$$C_x = \frac{\epsilon XW}{Z} \quad (2)$$

Neglecting the stray capacitance of the Z sensor, $C_{oz}$, the capacitance of the Z sensor formed by the wafer 14 and the plate 18 of the Z capacitor sensor is likewise defined as:

$$C_z = \frac{\epsilon A}{Z} \quad (3)$$

The voltage produced by the X sensor, $V_X$, depends upon the capacitance of the X sensor, $C_x$, the frequency of the applied voltage, F, the magnitude of the applied voltage, $V_{pp}$, and the resistance of the X capacitive circuit, $R_x$, as follows:

$$V_X = C_x F V_{pp} R_x \quad (4)$$

Substituting Equation (2) into Equation (4), multiplying by the factor A/A, and rearranging terms yields:

$$V_X = \frac{XW}{A} \frac{\epsilon A F V_{pp}}{Z} R_x \quad (5)$$

In a similar fashion, the current developed by the Z sensor can be written:

$$I_Z = C_z F V_{pp} \quad (6)$$

Substituting Equation (3) into Equation (6) and rearranging terms yields:

$$I_Z = \frac{\epsilon A F V_{pp}}{Z} = K \quad (7)$$

As will appear more fully below, by holding $I_Z$ equal to a constant, K, the voltage developed by the X capacitive sensor is made to depend exclusively on the X position only of the edge of the wafer 14 along the X axis. This is can be seen by substituting Equation (7) into Equation (5), as follows:

$$V_X = \frac{XW}{A} K R_x = \left( K \frac{W}{A} R_x \right) X \quad (8)$$

Figure 3B:
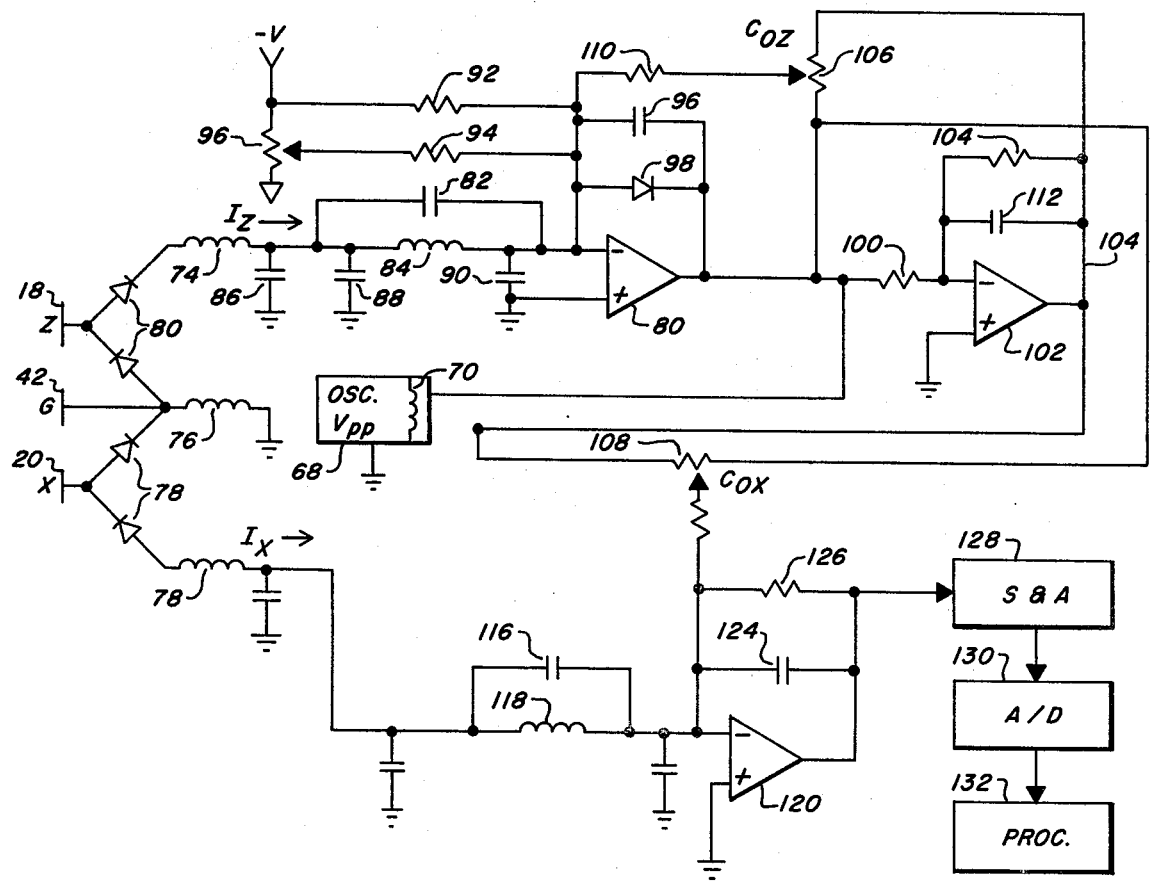

The X processor and Z compensator circuit 24 of the present invention is shown in FIG. 3B. Circuit 24 is operative to selectively control the value of the constant K, to compensate for the X and Z stray capacitances $C_{ox}$ and $C_{oz}$, and to stabilize and hold constant the value of the current through the sensor, $I_Z$. An oscillator 68 producing a voltage $V_{pp}$ of frequency F is inductively coupled to the X capacitive sensor 20, to the Z capacitive sensor 18, and to the guard electrode 42 from coil 80 to coils 72, 74, and 76, respectively. A pair of diodes 78 and 80 are respectively connected between the X and the Z sensors to separate the polarities of the drive currents $I_Z$ and $I_X$ for the X sensor and the Z sensor into different current legs to provide a D.C. average in the legs that are used to provide an output of the sensors.

The Z sensor signal is applied to the inverting input of an inverting amplifier 80 over a filter network composed of a capacitor 82 shunted by a coil 84 and grounded capacitors 86, 88, and 90. The non-inverting input of the operational amplifier 80 is connected to ground.

The inverting input of the inverting amplifier 80 is also connected to a source of potential, −V, over a biasing network having a fixed resistor 92, a fixed resistor 94, and a variable resistor 96. The resistor 96 is variable to selectively adjust the constant K of Equation (7). The impedance of the biasing network is selected to provide an essentially constant bias current at the inverting input of the amplifier 80. A capacitor 96 and a diode 98 are shunted between the inverting input and the output terminals of the amplifier 80 to stabilize the loop. The output terminal of the inverting amplifier 80 is connected in a feedback loop to the oscillator 68 maintaining a virtual ground at the input of amplifier 80 which stabilizes the current through the Z sensor 18 and holds it equal to a constant value. An increase (or decrease) in the current driving the inverting input of the amplifier 80 drives the output down (or up) which varies $V_{pp}$ in inverse proportion thereby stabilizing $I_Z$. This ensures, as shown above, that the voltage $V_X$ produced by the X sensor 20 will exclusively depend only on the position of the edge of the wafer along the X axis only.

To selectively compensate the stray capacitances, $C_{ox}$ and $C_{oz}$, the output of the inverting amplifier 80 is also connected over a resistor 100 to the inverting input of an operational amplifier 102, and over a line 104 to a variable resistor 106 and to a variable resistor 108. The output terminal of the inverting amplifier 102 is connected to the other terminals of the variable resistors 106 and 108. The wiper terminal of the variable resistor 106 is connected over a resistor 110 to the inverting input of amplifier 80. A stabilizing arrangement of a capacitor 112 and a resistor 114 is connected between the inverting and the output terminals of the inverting amplifier 104. A voltage proportional to $V_{pp}$ is generated on both sides of the variable resistor 106 of opposite polarity thereacross and used to selectively compensate the stray capacitance of the Z sensor, $C_{oz}$. Likewise, a voltage proportional in magnitude to $V_{pp}$ is produced on both sides of the variable resistor 108, also of one polarity on one side and of the opposite polarity on the other side thereof, and used to selectively compensate the stray capacitance of the X sensor, $C_{ox}$. The potentiometers 96, 106, and 108 are manually adjusted to compensate and correct the constant K, and the stray capacitances $C_{oz}$ and $C_{ox}$, respectively.

The current $I_X$ which is produced by the X sensor 20 is connected over a filter having a shunt arrangement of a capacitor 116 and a coil 118 to the inverting terminal of an operational amplifier 120. The inverting input of the amplifier 120 is also connected over a resistor 122 to the variable wiper terminal of the variable resistor 108. A shunt arrangement of a capacitor 124 and a resistor 126 is connected across the inverting and output terminals of the amplifier 120 to stabilize the loop. An amplified, stray capacitance, and Z compensated electrical signal having values that exclusively depend on the position of the edge of the wafer along the X axis only is provided at the output terminal of the amplifier 120.

A sample and hold circuit 128 of conventional design samples the analog output signal of the amplifier 120 at or above the Nyquist rate and holds the samples for a time sufficient to permit an analog-to-digital convertor 130 of conventional design to provide a digital representation of the applied analog signal. The data is then fed to a processor 132 which is operative as will appear more fully below to determine the centroid of the wafer, to determine the location of the flats, and to produce those X, θ, and Z corrective signals to the X, θ, and Z assembly 24 for aligning the wafer about its centroid and for orienting the flats selectively in space.

Figure 4:
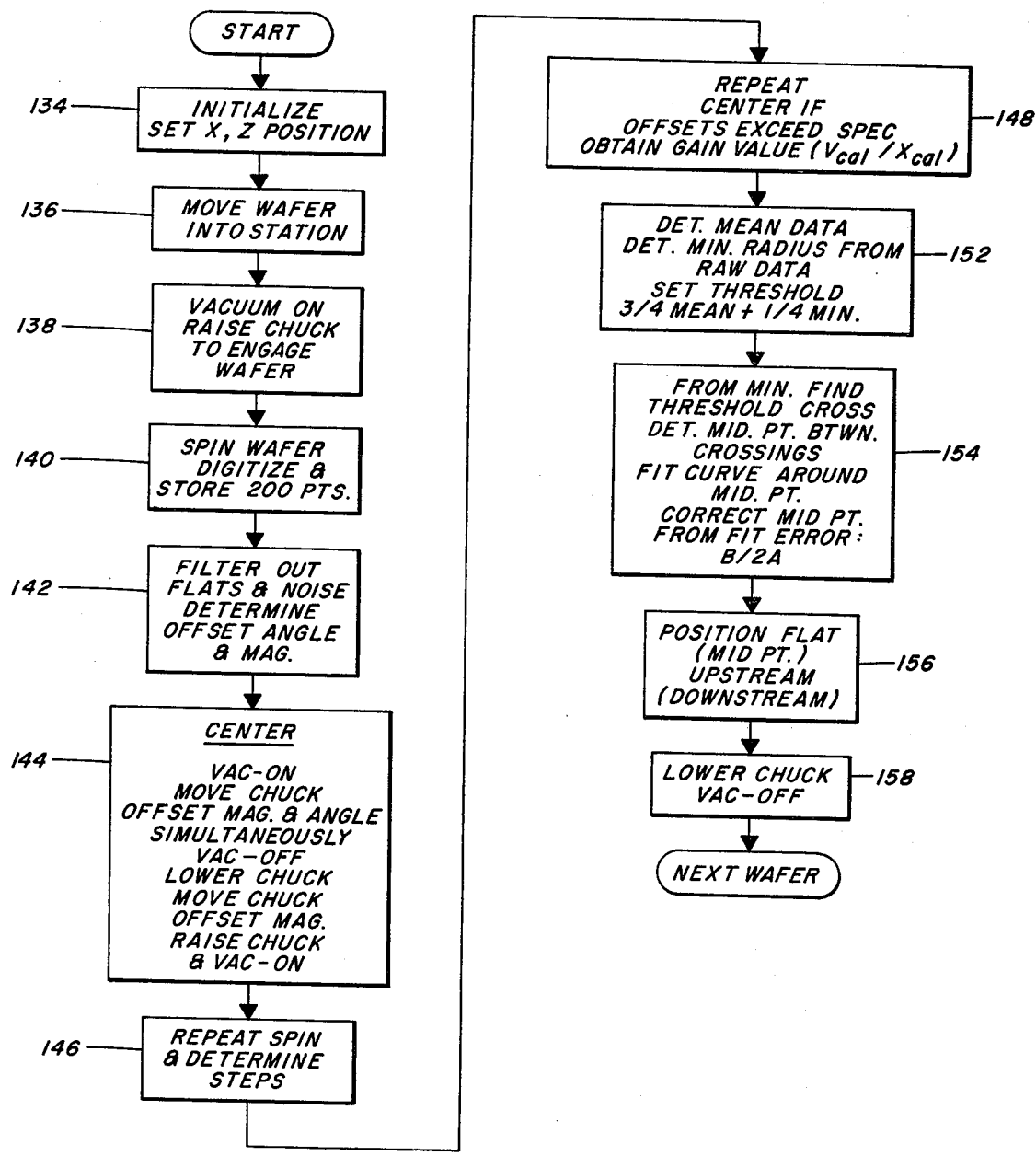
FIG. 4 shows a flow chart of the operation of the processor of the wafer alignment station of the present invention.

The processor 132 of the wafer alignment station 10 of the present invention preferably operates according to the flow chart shown in FIG. 4. Before starting, the K, $C_{ox}$, and $C_{oz}$ calibrations are assumed to have been made. As shown by block 134, the chuck is adjusted to an initial X and Z position; for example, the X mover may move the chuck from one (1) mm to seventy five (75) mm and the Z mover move the chuck above and below the level of the belts 0.01 inches to 0.02 inches. Typically, the X coordinate position initialization is adjusted to accommodate wafers of varying radius so that the edge of a wafer of a given radius is nominally positioned about the midpoint of the X sensor 20. The Z coordinate position is adjusted so that the initial starting position below the belts is known.

As shown by the block 136, a wafer is then moved into the station.

The vacuum is then activated and the chuck is raised to engage the wafer as shown by the block 138. An automatic gain check is performed to set the variation of $V_X$ with X. This is accomplished by moving the wafer incrementally along the X axis and taking "R" data points. Equations 21 and 22 to be described are used to calculate the gain value for the X sensor. The obtained gain values are used to normalize the data ($V_{cal}/X_{cal}$). It is noted that the gain check is also executed whenever a wafer does not automatically center itself. For example, at the time of the block 148 to be described, if the wafer fails to align, the processor is operative to set again the gain calibration value, and to repeat the centering process.

The wafer is then spun over the sensor 16 by the θ actuator one full turn of three hundred and sixty degrees (360°) to provide an electrical signal having values that exclusively represent the position of the edge of the sensor along the X axis only over the one full turn as shown by the block 140. The analog-to-digital converter then samples the signal and is operative to provide a digital representation of the signal, preferably digitizing two hundred (200) data points per revolution.

As shown by the block 142, the magnitude and angle from the X axis of the vector defined between the point corresponding to the centroid of the wafer and the point corresponding to the axis of the vacuum chuck is computed from the data. It is noted that the X offset component and the Y offset component of the vector could be computed as well.

Figure 5A:
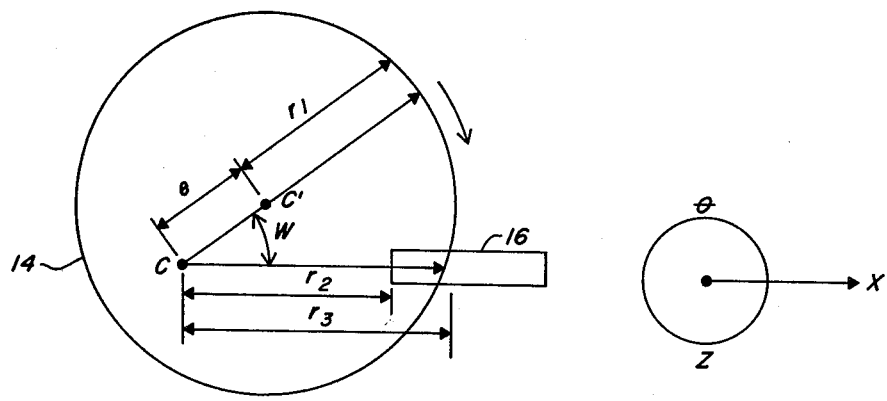
FIG. 5 shows a schematic in FIGS. 5A and 5B which illustrates the centering of a wafer about its centroid and in FIG. 5C shows a graph useful in illustrating the selective orientation of the flats in space.

Referring now to FIG. 5, the point C represents the center of the chuck, the point C' represents the centroid of the wafer, the angle W is the angle between C and C' measured from the X axis, and the letter "e" represents the distance from the point C' to the point C. The length $r_1$ is the radius of the wafer 14, the length $r_2$ represents the distance between the point C and the edge of the X sensor 20, and the length $r_3$ designates the distance from the chuck center C to the edge of the wafer along the X axis.

It may be readily shown that:

$$r_3 = e \cos(W) + \sqrt{r_1^2 - e^2 \sin^2(W)} \tag{9}$$

If $e/r_1$ is small, for example, less than 0.1, then:

$$r_3 \simeq e \cos(W) + r_1 - \left(\frac{e^2 \sin^2(W)}{2r_1}\right) \tag{10}$$

The output of the sensor 16, V, is given generally by:

$$V \simeq F\left(r_1 - r_2 + e \cos(W) - \left(\frac{e^2 \sin^2(W)}{2r_1}\right)\right) \tag{11}$$

where F is the gain of the sensor.

If the wafer is rotated about the chuck center C through an angle $-i\theta$, where $\theta = 2\pi/N$ and where N equals the number of steps per revolution, then equation (11) can be rewritten:

$$V(i\theta) \simeq F\left(r_1 - r_2 + e \cos(W - i\theta) - \frac{e^2 \sin^2(W - i\theta)}{2r_1}\right) \tag{12}$$

Fitting the data to Equation (12) in a least squares sine fit, yields:

$$W = \tan^{-1}\frac{M}{L} \tag{13}$$

$$e = (L^2 + M^2)^{\frac{1}{2}}(r_1 - r_2)/P \tag{14}$$

or $$e = (L^2 + M^2)^{\frac{1}{2}}/F \tag{15}$$

where, $$L = \frac{\begin{vmatrix} H & K & C \\ I & B & D \\ J & D & G \end{vmatrix}}{TAU} \tag{16}$$

$$M = \frac{\begin{vmatrix} A & H & C \\ K & I & D \\ C & J & G \end{vmatrix}}{TAU} \tag{17}$$

$$P = \frac{\begin{vmatrix} A & K & H \\ K & B & I \\ C & D & J \end{vmatrix}}{TAU} \tag{18}$$

$$TAU = \begin{vmatrix} A & K & C \\ K & B & D \\ C & D & G \end{vmatrix} \tag{19}$$

and where:

$$A = \sum_{i=0}^{N-1} \cos^2(i\theta) \tag{20A}$$

$$B = \sum_{i=0}^{N-1} \sin^2(i\theta) \tag{20B}$$

$$C = \sum_{i=0}^{N-1}{}' \cos(i\theta) \qquad (20C)$$

$$D = \sum_{i=0}^{N-1}{}' \sin(i\theta) \qquad (20D)$$

$$K = \sum_{i=0}^{N-1}{}' \cos(i\theta)\sin(i\theta) \qquad (20E)$$

$$G = \sum_{i=0}^{N-1}{}' 1 \qquad (20F)$$

$$H = \sum_{i=0}^{N-1}{}' \cos(i\theta) V(i\theta) \qquad (20G)$$

$$I = \sum_{i=0}^{N-1}{}' \sin(i\theta) V(i\theta) \qquad (20H)$$

$$J = \sum_{i=0}^{N-1}{}' V(i\theta) \qquad (20I)$$

The prime on the summation symbol in Equation (20) denotes a sum which excludes values of the "i" index where the absolute value of the term $$2V(i\theta) - V(i\theta - \gamma) - V(i\theta + \gamma)$$

is greater than a preselected threshold, and where $\gamma$ is a preselected integral multiple of $\theta$. In this manner, the processor is operative to digitally filter out those data points which correspond to noise and the flats information.

The value of F is calculated by moving the wafer back and forth "R" times along the X axis and obtaining "R" measurements of V (iX), and calculating:

$$F = \frac{\begin{vmatrix} V & U \\ W & R \end{vmatrix}}{Q} \qquad (21)$$

where $$Q = \begin{vmatrix} T & U \\ U & R \end{vmatrix} \qquad (22A)$$

$$T = \sum_{i=0}^{R-1} i^2 \qquad (22B)$$

$$U = \sum_{i=0}^{R-1} i \qquad (22C)$$

$$V = \sum_{i=0}^{R-1} i X_i \qquad (22D)$$

$$W = \sum_{i=0}^{R-1} X_i \qquad (22E)$$

The processor is operative to calculate the eccentricity and angle components according to the above relations and produces a plurality of corrective signals to the X, Z, and $\theta$ stepping motors to center the wafer about its centroid.

Figure 5B:
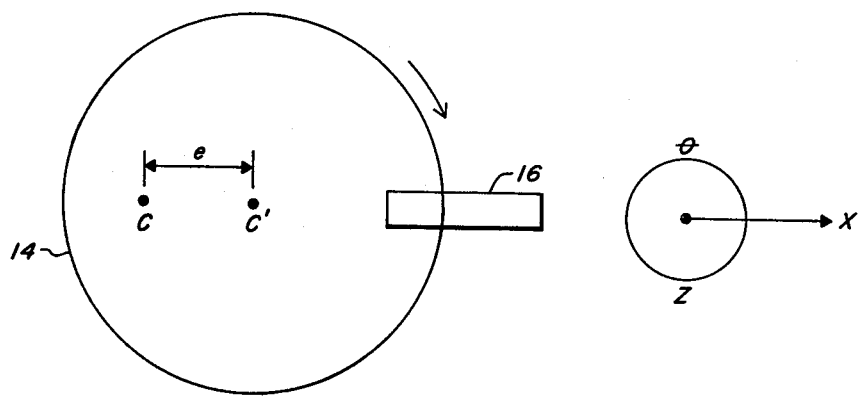

This is preferably accomplished as shown by the block 144. First, with the vacuum activated, the chuck simultaneously moves in the $\theta$ and X coordinates the angle W and the distance "e" as shown in FIG. 5B. The centroid of the wafer C' ought now be aligned with the point C. The vacuum is disengaged and the chuck lowered. The chuck is then moved back the distance "e" along the X axis to the centroid point C'.

The chuck is then raised, the vacuum engaged, and as shown by the block 146, the spin and determine steps are repeated.

As shown by the block 148, the centering step 144 is repeated if the magnitude and angle of the offset exceeds a specified tolerance, and the gain calibration is repeated, if found necessary.

Figure 5C:
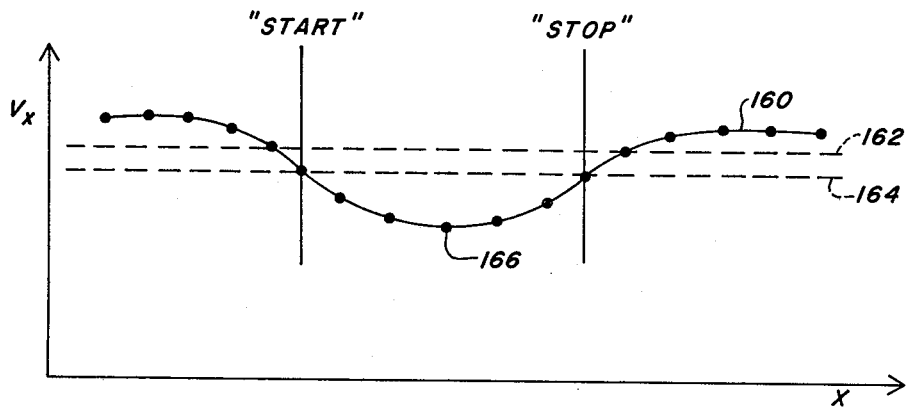

After centering the wafer about its centroid, the angle $\beta$ of the flats relative to the X axis is determined and a $\beta$ corrective signal is produced for selectively orienting the flat in space. As shown by the block 152, the mean value of the data taken during the previous spin is computed. The raw data is scanned to find the data point having a minimum value. A threshold is computed which is preferably equal to three-fourths of the mean value of the data plus one-fourth the value of the minimum data point as shown in FIG. 5C, where the line 160 represents the data points, the dashed line 162 represents the mean of the data, the dashed line 164 represents the selected threshold value, and the arrow 166 represents the minimum point of the raw data plotted in a Cartesian system where the ordinate is designated $V_X$ and the abscissa is designated X, where X represents the angle $\theta$.

The processor is then operative to scan the data and to identify the left-threshold crossing of the data as designated "start" and the right-threshold crossing of the data as designated "stop". The center of the flat is roughly located one half way of the distance between the "start" and "stop" data points. The processor is then operative to fit any even function with a continuous derivative, preferably a parabola, to the "S" data points between the "start" and "stop" locations to finely determine the $\beta$ corrective angle of the flat according to the relations:

$$DET = \begin{vmatrix} X^4 & X^3 & X^2 \\ X^3 & X^2 & X \\ X^2 & X & S \end{vmatrix} \qquad (23)$$

$$TAU = \begin{vmatrix} X^2 Y & X^3 & X^2 \\ X Y & X^2 & X \\ Y & X & S \end{vmatrix} \qquad (24)$$

$$A = \frac{TAU}{DET} \qquad (25)$$

$$TAU' = \begin{vmatrix} X^4 & X^2 Y & X^2 \\ X^3 & X Y & X \\ X^2 & Y & S \end{vmatrix} \qquad (26)$$

$$B = \frac{TAU'}{DET} \qquad (27)$$

$$CENTER = \frac{B}{2A} \text{ ; and} \qquad (28)$$

$$\beta = 2 * CENTER \qquad (29)$$

where $$X = \sum_{i=0}^{S-1} i\theta \qquad (30A)$$

-continued $$X^2 = \sum_{i=0}^{S-1} i^2\theta^2 \qquad (30B)$$

$$X^3 = \sum_{i=0}^{S-1} i^3\theta^3 \qquad (30C)$$

$$X^4 = \sum_{i=0}^{S-1} i^4\theta^4 \qquad (30D)$$

$$YX = \sum_{i=0}^{S-1} V(i\theta)\, i\theta \qquad (30E)$$

$$YX^2 = \sum_{i=0}^{S-1} V(i\theta)\, i^2\theta^2 \qquad (30F)$$

$$YX^3 = \sum_{i=0}^{S-1} V(i\theta)\, i^3\theta^3; \text{ and} \qquad (30G)$$

$$Y = \sum_{i=0}^{S-1} V(i\theta) \qquad (30H)$$

After computing the angle $\beta$ of the flat relative to the X axis, the processor is operative to produce a $\beta$ correction signal to the $\theta$ actuator to selectively orient the flat in space, usually in either an upstream or a downstream position as shown by the block 150. The vacuum is then disengaged and the chuck lowered as shown by the block 152. The next wafer is brought into the station 10 for alignment.

As noted above step 148 is operative to repeat the spin and determine steps 140 and 142 and center step 144 if a centering error persists. After a predetermined number of tries, for example three, step 148 will produce a gain recalibration, before a further centering attempt. Also, if the offset data of step 142 indicates a positioning error above a certain threshold, repeated recentering attempts will be made upon a selected number after which an error condition is set.

Other variations in the implementation of the invention, as defined solely in the following claims, may also be utilized.

What is claimed is:

1. Apparatus for aligning a wafer about its centroid, comprising:
    a platform for removably holding said wafer for rotation about an axis of rotation;
    a first means, connected to said platform, for rotating said platform about the axis of rotation $\theta$ radians, for moving said platform along an X axis, and for moving said platform along a Z axis orthogonal to the X axis;
    a second means positioned near said platform responsive to the rotation of the wafer about the axis of rotation over a predetermined angular range of rotation for providing an electrical signal having values that are representative of the position of the edge of said wafer along said X axis relative to the axis of rotation as the wafer rotates through said predetermined angular range; and
    a third means coupled to said first means and responsive to said electrical signal for providing data representative of the location of the centroid of said wafer relative to the axis of rotation and for producing from said data a plurality of corrective signals to said first means for aligning said centroid of said wafer about the axis of rotation.

2. The apparatus of claim 1 wherein said second means includes a first capacitive sensor for providing a first signal whose value depends on the X and the Z coordinate of the position of the edge of said wafer, and a second capacitive sensor for providing a second signal whose value depends on the Z coordinate of the position of the edge of said wafer, and further including a fourth means responsive to said first and said second signals, for providing said electrical signal having values that are representative of the edge of said wafer along said X axis over said predetermined angular range.

3. The apparatus of claim 2 wherein said fourth means includes an oscillator coupled to said first and said second sensors, a substantially constant current source, and a high gain amplifier, the inverting input of said amplifier is connected to said current source and to said second signal, and the output terminal of said amplifier is connected in a feedback loop to said oscillator for stabilizing the value of the current of said second signal.

4. The apparatus of claim 1 wherein said wafer has a generally circular perimeter having a flat region, and wherein said third means further is operative to determine the location of said flat region and to produce a $\beta$-corrective signal for aligning said flat region in a preselected spatial direction.

5. The apparatus of claim 4 wherein said third means includes an A/D converter for providing a digital representation of said electrical signal and a microprocessor, responsive to said digital representation, for determining the position of said centroid, for determining the location of said flat region, and for producing said plurality of corrective signals.

6. The apparatus of claim 5 wherein said microprocessor is operative according to the steps, comprising:
    spin said wafer one full turn to obtain said digital representation of said electrical signal;
    calculate from said representation of said electrical signal the magnitude and the angle components of the vector defined between the point which corresponds to said centroid and the point which corresponds to the axis of rotation of said platform; and
    produce from said magnitude and angle components said corrective signals to align said wafer about its centroid.

7. The apparatus of claim 6 further including the steps, comprising:
    spin said centered wafer a second full turn to obtain a digital repesentation of a second electrical signal having values that are representative of the position of the edge of said wafer aligned about its centroid;
    calculate from said second digital electrical signal the angle $\beta$ that corresponds to the position of said flat region relative to said X axis; and
    produce said $\beta$-corrective signal to align said flat region selectively in space.

8. The apparatus of claim 1 wherein said platform is a vacuum chuck.

9. The apparatus of claim 8 wherein said vacuum chuck is operatively connected to a motor-driven carriage for movement along said X axis in response to an X direction corrective signal of said plurality of corrective signals, to a $\theta$ motor for rotation about the axis of said chuck in response to a $\theta$ rotation corrective signal of said plurality of corrective signals, and to a stepping motor for movement about said Z axis in response to a Z movement corrective signal of said plurality of corrective signals.

10. A method for aligning a wafer, comprising the steps of:
supporting said wafer for rotation about an axis of rotation and for translation along an X and a Z axis;
sensing the position of the edge of the wafer along said X axis relative to the axis of rotation at multiple angles of rotation $i\theta$ over a predetermined angular range of rotation of the wafer about said axis of rotation;
computing an eccentricity vector from said sensed position of the edge of the wafer over said predetermined angular range having a magnitude "e" representative of the spacial dislocation of the centroid of the wafer relative to the axis of rotation and having a direction "W" representative of the angle subtended by the ray connecting the axis of rotation and the centroid point relative to the X axis; and
applying control signals derived from said eccentricity vector to align the centroid of the wafer about the axis of rotation.

11. A method as recited in claim 10, wherein the perimeter of the wafer has at least one flat region, and further including the steps of:
sensing the position of the edge of the wafer along said X axis relative to the axis of rotation at multiple angles of rotation $i\theta$ over a predetermined angular range of rotation after having been aligned about its centroid;
computing from the sensed position of the edge of the wafer along said X axis aligned about its centroid the $\beta$ angle that corresponds to the angle that a preselected one of said flats makes with respect to the X axis; and
applying a control signal derived from said $\beta$ angle to orient said preselected flat selectively in space.

12. A method as recited in claim 11, wherein said $\beta$ angle is computed according the relations:

$$DET = \begin{vmatrix} X^4 & X^3 & X^2 \\ X^3 & X^2 & X \\ X^2 & X & S \end{vmatrix}$$

$$TAU = \begin{vmatrix} X^2 & YX^3 & X^2 \\ X & YX^2 & X \\ Y & X & S \end{vmatrix}$$

$$A = \frac{TAU}{DET}$$

$$TAU' = \begin{vmatrix} X^4 & X^2Y & X^2 \\ X^3 & X & YX \\ X^2 & Y & S \end{vmatrix}$$

$$B = \frac{TAU'}{DET}$$

$$CENTER = \frac{B}{2A}$$

$$\beta = 2 * CENTER$$

where $$X = \sum_{i=0}^{S-1} i\theta$$

$$X^2 = \sum_{i=0}^{S-1} i^2\theta^2$$

$$X^3 = \sum_{i=0}^{S-1} i^3\theta^3$$

$$X^4 = \sum_{i=0}^{S-1} i^4\theta^4$$

$$YX = \sum_{i=0}^{S-1} V(i\theta)i\theta$$

$$YX^2 = \sum_{i=0}^{S-1} V(i\theta)i^2\theta^2$$

$$YX^3 = \sum_{i=0}^{S-1} V(i\theta)i^3\theta^3$$

$$Y = \sum_{i=0}^{S-1} V(i\theta)$$

where "$V(i\theta)$" is the sensed position of the edge of the wafer at corresponding angles $i\theta$.

13. A method as recited in claim 10, wherein said sensing step includes:
spinning said wafer over a sensor having an X and a Z sensor;
compensating the Z sensor output signal to hold the valve of the current of the Z sensor equal to a constant valve for providing a sensor output signal having valves that exclusively represent the position of the edge of the wafer along the X axis only; and
digitizing the sensor output signal to provide data.

14. A method as recited in claim 13, wherein said sensor has a gain of "F", and wherein, if after computing said eccentricity vector and applying said control signals to align said wafer about its centroid said wafer is not so aligned, then further including the step of:
compensating the gain "F" of said sensor to recalibrate the data.

15. A method as recited in claim 14, wherein said compensating step includes the steps of:
moving said wafer along said X axis to obtain a plurality of data values $V(xi)$; and
adjusting the gain of said sensor according to the relations:

$$F = \frac{\begin{vmatrix} V & U \\ W & R \end{vmatrix}}{Q}$$

where $$Q = \begin{vmatrix} T & U \\ U & R \end{vmatrix}$$

$$T = \sum_{i=0}^{R-1} i^2$$

$$U = \sum_{i=0}^{R-1} i$$

-continued $$V = \sum_{i=0}^{R-1} i X_i$$

$$W = \sum_{i=0}^{R-1} X_i$$

16. A method as recited in claim 10, wherein the sensing step is accomplished by a sensor having a gain "F", and wherein the eccentricity vector having a magnitude "e" and direction "W" is computed according to the relations:

$$V(i\theta) \simeq F(r_1 - r_2 - e\cos(W - i\theta) - \frac{e^2\sin^2(W - i\theta)}{2r_1}$$

where $$W = \tan^{-1}\frac{M}{L}$$

$$e = (L^2 + M^2)^{\frac{1}{2}}/P$$

where $$L = \frac{\begin{vmatrix} H & K & C \\ I & B & D \\ J & D & G \end{vmatrix}}{TAU}$$

$$M = \frac{\begin{vmatrix} A & H & C \\ K & I & D \\ C & J & G \end{vmatrix}}{TAU}$$

$$P = \frac{\begin{vmatrix} A & K & H \\ K & B & I \\ C & D & J \end{vmatrix}}{TAU}$$

$$TAU = \begin{vmatrix} A & K & C \\ K & B & D \\ C & D & G \end{vmatrix}$$

where $$A = \sum_{i=0}^{N-1}{}' \cos^2(i\theta)$$

$$B = \sum_{i=0}^{N-1}{}' \sin^2(i\theta)$$

$$C = \sum_{i=0}^{N-1}{}' \cos(i\theta)$$

$$D = \sum_{i=0}^{N-1}{}' \sin(i\theta)$$

$$K = \sum_{i=0}^{N-1}{}' \cos(i\theta)\sin(i\theta)$$

$$G = \sum_{i=0}^{N-1}{}' 1$$

$$H = \sum_{i=0}^{N-1}{}' \cos(i\theta) V(i\theta)$$

$$I = \sum_{i=0}^{N-1}{}' \sin(i\theta) V(i\theta)$$

-continued $$J = \sum_{i=0}^{N-1}{}' V(i\theta)$$

and where "V(i $\theta$)" is the sensed position of the edge of the wafer at corresponding angles (i $\theta$), "$r_1$" is the radius of the wafer, "$r_2$" is the distance from the axis of rotation to the sensor location, and where the prime in the summation symbols denotes a sum which excludes those values of "i" where the absolute value of the term $2V(i\,\theta) - V(i\,\theta - \gamma) - V(i\,\theta + \gamma)$ is greater than a preselected threshold, where $\gamma$ is a preselected integral multiple of $\theta$.

17. A wafer alignment station, comprising:
a platform for rotatably supporting a wafer about an axis of rotation;
means responsive to the rotation of said wafer about the axis of rotation for providing first data respectively representative of the position of the edge of the wafer about the axis of rotation as the wafer rotates about the axis at corresponding angular orientations over a first predetermined angular range of rotation;
means connected to the wafer edge data providing means and responsive to the first data for providing second data representative of the location of the centroid of the wafer relative to the axis of rotation; and
means connected to the centroid location providing means and to the platform and responsive to said second data for centering the centroid of the wafer in alignment with the axis of rotation.

18. A wafer alignment station as recited in claim 17, wherein said centering means includes an X, Z, and $\theta$ assembly having an X, Z, and $\theta$ actuator connected to said platform and actuated in response to an X, Z, and $\theta$ control signal provided by said centering means for controllably translating and rotating said platform.

19. A wafer alignment station as recited in claim 17, wherein said wafer edge data providing means includes a sensor positioned near said wafer and connected to an X processor and Z compensator circuit providing an output signal having values that respectively represent the position of the edge of said wafer relative to said axis of rotation at corresponding angular orientations over said first predetermined angular range of rotation.

20. A wafer alignment station as recited in claim 19, further including a digital to analog converter connected to said output signal for providing said first data.

21. A wafer alignment station as recited in claim 20, wherein said centering means includes a processor responsive to said second data and operative to produce said X, Z, and $\theta$ control signal to said X, Z, and $\theta$ actuators for centering said cetroid of said wafer about the axis of rotation.

22. A wafer alignment station as recited in claim 21 wherein said wafer has a generally circular perimeter having a flat region, and wherein said processor is further operative to produce a $\theta$ control signal to said $\theta$ actuator to selectively orient said flat region in space.

23. The wafer alignment station of claim 17, wherein said wafer has a flat region along its perimeter, wherein said wafer edge data providing means is further operative to provide third data respectively representative of the position of the edge of the wafer about the axis of rotation as the wafer rotates about the axis of rotation at corresponding angular orientations over a second predetermined angular range of rotation with the centroid of the wafer in alignment with the axis of rotation; and further including means responsive to the third data for selectively orienting said flat region in space.

* * * * *

UNITED STATES PATENT AND TRADEMARK OFFICE
CERTIFICATE OF CORRECTION

PATENT NO. : 4,457,664
DATED : July 3, 1984
INVENTOR(S) : Neil H. Judell et al

It is certified that error appears in the above-identified patent and that said Letters Patent are hereby corrected as shown below:

In the list of Inventors: "Noel S. Podiye" should read

--Noel S. Poduje--.

Column 4, line 13, "selected water" should read --selected wafer--.

Column 16, line 51, "cetroid" should read --centroid--.

Signed and Sealed this

Fifteenth Day of January 1985

[SEAL]

Attest:

GERALD J. MOSSINGHOFF

Attesting Officer     Commissioner of Patents and Trademarks

REEXAMINATION CERTIFICATE (2077th)
United States Patent [19]
Judell et al.

[11] B1 4,457,664
[45] Certificate Issued Aug. 24, 1993

[54] WAFER ALIGNMENT STATION

[75] Inventors: Neil H. Judell, Jamaica Plain; Robert C. Abbe, Newton; Noel S. Podiye, Needham Heights; Roy Mallory, Bedford, all of Mass.

[73] Assignee: ADE Corporation, Newton, Mass.

Reexamination Request:
No. 90/002,215, Nov. 30, 1990

Reexamination Certificate for:
Patent No.: 4,457,664
Issued: Jul. 3, 1984
Appl. No.: 360,386
Filed: Mar. 22, 1982

[51] Int. Cl.⁵ ............................................. B65G 47/24
[52] U.S. Cl. ..................................... 414/779; 33/520; 198/394; 198/395; 414/754; 414/757; 414/786
[58] Field of Search ............... 414/779, 757, 754, 786; 901/47, 46; 198/394, 395; 356/400, 399, 150; 250/548, 506, 561; 364/559, 560; 33/520, 568, 569, 613, 644, 645, 661, 670, 673; 358/107; 382/8

[56] References Cited

U.S. PATENT DOCUMENTS

| | | | |
|---|---|---|---|
| 4,026,031 | 5/1977 | Siddall et al. | 364/560 X |
| 3,618,742 | 11/1971 | Blanchard | 198/395 |
| 3,604,940 | 9/1971 | Mathews | 250/560X |
| 4,425,075 | 1/1984 | Quinn | 414/744 |
| 3,870,416 | 3/1975 | Brady et al. | 356/399 X |
| 4,024,494 | 5/1977 | Adams et al. | 198/394 |
| 4,376,581 | 3/1983 | Mayer . | |
| 4,165,132 | 8/1979 | Hassan et al. | 104/134X |

FOREIGN PATENT DOCUMENTS

| | | | |
|---|---|---|---|
| 2552927 | 6/1977 | W. Germany | 901/47 |
| 1436721 | 5/1976 | U.K. . | |

OTHER PUBLICATIONS

Wojcik, Zbigniew, "A Method of Automatic Centering of Chips, Masks, and Semiconductor Wafers", Electron Technology, 10, 3 pp. 79-96, 1977.

Gagne M. et al., "No-Edge Contract Wafer Orienter", IBM Technical Disclosure Bulletin Vol. 17, No. 18, Jan. 1975.

*Primary Examiner*—Michael S. Huppert

[57] ABSTRACT

An automatic wafer alignment station is disclosed for aligning a wafer having flats about its centroid with the flats oriented in a preselected spatial direction. The wafer is held by a vacuum chuck which is operatively connected to a motor driven carriage for controlled movement about an X axis, to a $\theta$ actuator carried by the carriage for controlled rotation about the axis of the chuck, and to a Z actuator carried by the carriage for controlled motion about a Z axis. An X capacitive sensor and a Z capacitive sensor are positioned near the wafer. An X processing and Z compensating circuit is responsive to the X and the Z capacitive sensor output signals and provides an electrical signal that has values which exclusively represent the position of the edge of the wafer along the X axis only over a predetermined angular range. Circuit means including an A/D converter and a microprocessor respond to the electrical signal and produce a plurality of corrective signals to the X, Y, and $\theta$ actuators for aligning the wafer about its centroid and for orienting the flats of the wafer in a preselected spatial orientation.

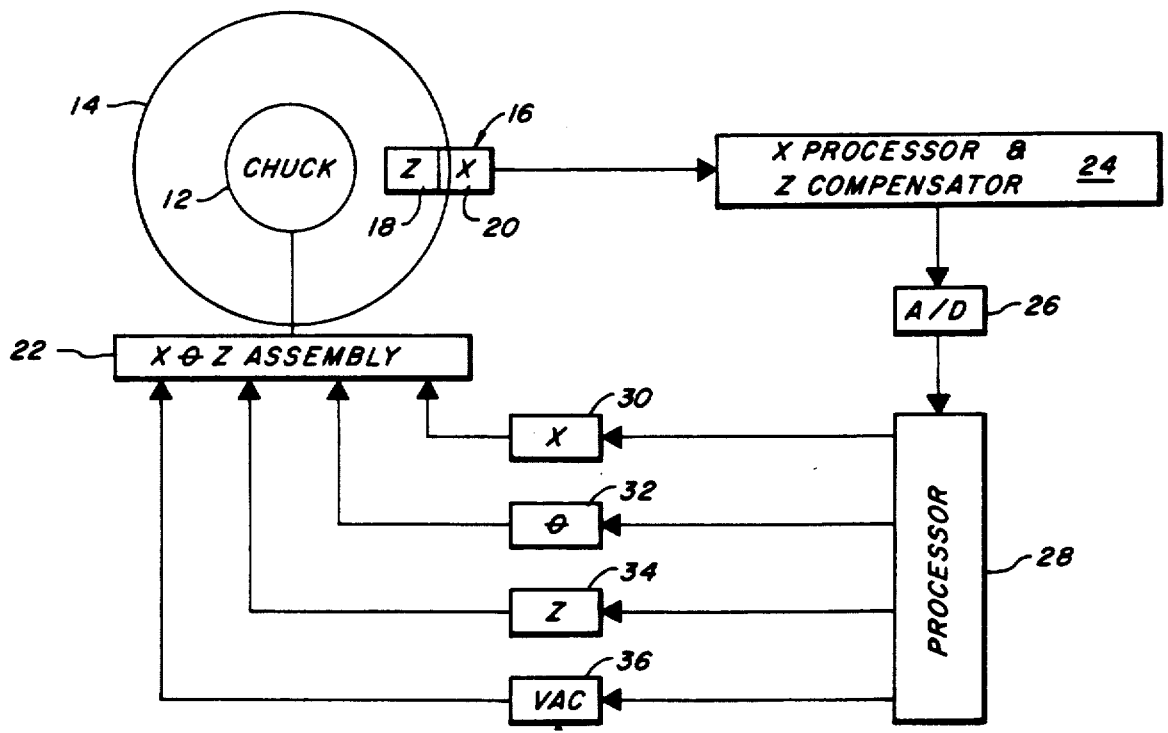

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–23 is confirmed.

* * * * *